United States Patent [19]

Heiart et al.

[11] 4,343,876

[45] Aug. 10, 1982

[54] DOT-ENLARGEMENT PROCESS FOR PHOTOPOLYMER LITHO MASKS

[75] Inventors: Robert B. Heiart, Middletown; James W. O'Neil, Howell, both of N.J.

[73] Assignee: E. I. Du Pont de Nemours and Company, Wilmington, Del.

[21] Appl. No.: 209,202

[22] Filed: Nov. 21, 1980

[51] Int. Cl.³ .............................................. G03C 5/00
[52] U.S. Cl. ........................................ 430/5; 430/6; 430/311; 430/319; 430/320; 430/321; 430/313; 430/396; 430/325
[58] Field of Search .............. 430/306, 309, 321, 322, 430/325, 5, 320, 396, 6, 311, 319, 313

[56] References Cited

U.S. PATENT DOCUMENTS

| | | | |
|---|---|---|---|
| 3,157,717 | 2/1964 | Thommes | 264/36 |
| 3,255,004 | 4/1966 | Thommes | 96/35 |
| 3,262,780 | 7/1966 | Thommes | 96/48 |
| 4,125,650 | 11/1978 | Chiu et al. | 430/5 |
| 4,173,673 | 6/1979 | Bratt et al. | 428/217 |

*Primary Examiner*—Won H. Louie, Jr.

[57] ABSTRACT

An imaged element containing a polymeric relief or stencil image, in which the polymer contains crosslinkable moieties, is subjected to an image enlargement process by contacting the image with a solution containing a swelling agent for the image, and a crosslinking agent. The process is particularly useful in enlarging the half-tone image dot area of photopolymer litho masks wherein the half-tone image areas consist of hardened upper skins which rest on softer undervolumes having a lesser degree of polymerization or hardening.

20 Claims, No Drawings

DOT-ENLARGEMENT PROCESS FOR PHOTOPOLYMER LITHO MASKS

FIELD OF THE INVENTION

This invention relates to dot image-containing masks, useful for copy preparation and related purposes, and more particularly to a process of enlarging the polymeric dots of a halftone image mask. Masks are used in imagewise exposing other photosensitive elements with actinic radiation.

BACKGROUND OF THE INVENTION

In the photomechanical arts, a mask containing an image that is opaque to actinic radiation is used as an intermediate or "master" in preparing a printing plate of some kind; whether letterpress or lithographic, the method of producing the plate is much the same. A metal (or in some cases, plastic) plate coated with a photosensitive resist-forming material is exposed to actinic light through the mask. After exposure, the plate is developed by treatment with a solvent that removes either the exposed or the unexposed material. This leaves a resist image which protects the resist-covered areas of the printing plate from the acid used in etching the plate (in the case of letterpress) or from the various hydrophilic coatings used in lithography. Relief and lithographic printing plates may also be prepared directly from such masks, as exemplified in U.S. Pat. No. 2,760,863 and U.S. Pat. No. 3,458,311.

For production of such masks, "litho" (for lithographic) films are preferable, because they employ photosensitive silver halide emulsions which are capable of producing extremely sharp images, i.e., images of high density and contrast. Litho films of this type permit the continuous density variations in the original transparency or image to be rendered as a halftone image consisting of an array of opaque dots of variable sizes or areas and complementary transparent areas. Such processes of forming litho masks are described in Chapter IV of "The Printing Industry" by Victor Strauss, published by Printing Industries of America (1967). The tonal characteristics of the image (tone referring to gradations within a color hue) are determined by the dot size, i.e., the percent of the surface area in any small region covered by halftone dots. Reducing or enlarging this percent by reducing or enlarging the area of the halftone dots thereby changes the tone values of the image. This principle is widely applied in lithography, and is important in correcting color work. It thus permits tone values or color strength to be changed during the photographic steps rather than on the printing plate.

When producing a mask from a litho film, the latter is exposed through a vignette halftone screen and a continuous tone image transparency and then developed, thereby forming a halftone image consisting of an array of opaque dots on completely transparent areas.

It is known to effect dot size reduction, or dot etching, with conventional silver halide litho film by treating the film area with an oxidant for the silver in the dot image, but there is no similar direct method for enlarging such dots. One method of dot enlargement entails touch-up of a continuous-tone transparency by manually adding density, e.g., with an air brush or pen and ink, and then producing a completely new halftone mask therefrom. A second method of dot enlargement is to produce a halftone negative of the original halftone mask, dot etch the negative, and from the dot-etched negative produce a second halftone mask which is then a reproduction of the original mask but with enlarged dots. Both of these methods are expensive and time consuming.

It is also known to effect dot size reduction, or "dot etching", in photopolymer lithographic masks; this is described in U.S. Pat. No. 4,173,673. In addition to the methods used for silver halide masks, dot enlargement of photopolymer masks has also been achieved by two other methods: (1) by a burnishing technique, (2) by treating the film area with a solution of a swelling agent and a fatty acid, followed by stabilizing the swollen dot image by treatment with an aqueous solution so as to precipitate the salt of the acid within the matrix. However, the swollen image shrinks partially over a period of time, and the burnishing method is useful only for small areas where uniformity is not critical. There is need for a better method of changing the tonal values of photopolymer masks by image enlargement, particularly for a method which will uniformly and irreversibly enlarge the polymeric dots of a halftone image mask by a simple treatment.

SUMMARY OF THE INVENTION

The invention provides a process of permanently enlarging the size of or area covered by a stencil or relief image formed in a polymer mask wherein the polymer is one which contains crosslinkable moieties. This process consists essentially of contacting said image with a solution containing a swelling agent to effect image enlargement, and a crosslinking agent to react with and link the crosslinkable moieties of the polymer. Thereby the image is enlarged, and is fixed in its enlarged state.

By stencil or relief image formed in the polymer mask is meant a three-dimensional raised image such as a printing plate or resist image. A stencil image more particularly describes those voids or channels defined and bounded by a thin relief, e.g., an image formed by a resist. In either case, however, the dimension most affected by the enlargement process is the area covered by the relief rather than its thickness. The polymer mask referred to above may be a photopolymerized or photocrosslinked mask. The process is particularly useful in enlarging the half-tone image dot area of photopolymer litho masks wherein the half-tone image areas consist of hardened upper skins which rest on softer under-volumes having a lesser degree of polymerization or hardening.

DETAILED DESCRIPTION OF THE INVENTION

For the process to be useful, the polymer mask which is formed by the stencil or relief image must be capable of being swollen and must contain a polymeric or colloid material containing crosslinkable sites which, when reacted with a crosslinking agent, rapidly form a rigid network. Preferably the crosslinkable sites or moieties on the polymeric or colloid material are acid moieties, and particularly carboxylic acid moieties. Such acid-containing polymers may be present as binders in the material used to make the stencil or relief image or they may be produced during the formation of the image. In either case, acid moieties are present in the swellable image for use as a crosslinking site. Crosslinkable sites or moieties on the polymeric or colloid material which are also useful include hydroxyl groups and basic moieties such as amino groups.

The image enlarging process of this invention can be used on diverse polymeric relief or stencil images such as those disclosed in U.S. Pat. No. 4,173,673, U.S. Pat. No. 4,162,162, U.S. Pat. No. 4,126,466, U.S. Pat. No. 4,198,242, U.S. Pat. No. 4,191,572; U.S. Pat. No. 4,211,561; Belgian Pat. No. 877846; U.K. Pat. No. 1,507,704; copending application Ser. No. 153,639 filed May 27, 1980 and copending application Ser. No. 142,023 filed Apr. 21, 1980, all of which are incorporated herein by reference.

This invention is particularly related to the subject matter of aforementioned U.S. Pat. No. 4,173,673, "Dot-Etchable Mask from Photopolymerizable Elements". That patent is directed to a halftone image mask comprising a transparent support bearing a tone-correctable image composed of polymeric dots with an optical density of 3.0, which can be dot-etched, i.e., the dots reduced in size or area by solvent edge-undercutting followed by mechanical action, e.g., by rubbing, brushing, or spraying. The present invention proceeds in the opposite direction. Instead of reducing the size or area of the halftone dots, the present invention is directed to increasing their size or area, and permanently fixing them in the enlarged state. It is believed that this has not been previously achieved.

A mask suitable for contact speed lithographic work is readily provided by imagewise exposing to actinic radiation through a halftone image a layer of a photopolymerizable composition coated upon a transparent support film, and then developing by washing out the unexposed areas to leave a suitable dot image mask on the support film. Dyes or pigments, e.g., colloidal carbon, may be added to the photopolymerizable layer beforehand, so that the photopolymer image will be opaque in both the ultraviolet and visible regions of the spectrum. In this way a continuous tone image is converted into printable half-tone form. The photopolymerizable composition, typically, will consist essentially of:

(a) an ethylenically unsaturated monomer capable of forming a high molecular weight polymer by free radical-initiated, chain-propagating, addition polymerization, 10-30% by weight, (b) a polymeric binder, 10-60% by weight, (c) a free radical-generating addition polymerization initiator system activatable by actinic radiation, 0.1-20% by weight, and, (d) an actinic radiation-absorber, present in such concentration as to impart an optical density to the photopolymerizable layer of at least 3.0 over at least the spectral range of 350-400 nm.

The makeup of components a, b, c, and d is described in detail in U.S. Pat. No. 4,173,673, supra, incorporated by reference, particularly at columns 5-9 thereof.

It is preferred that polymeric binder (b) be so selected that the unexposed photopolymerizable composition is soluble in predominantly aqueous solutions, e.g., dilute aqueous alkaline solutions, but it should become relatively insoluble therein upon exposure to actinic radiation. Typically, polymers which satisfy these criteria are carboxylated, e.g., vinyl addition polymers containing free carboxyl groups. Where aqueous development is not required, a wide variety of binders may be used, as disclosed in prior art photopolymerizable compositions. The photopolymerizable composition must contain polymeric material having sufficient reactive moieties (e.g., free carboxyl groups) which survive image exposure, so as to be available to further crosslink with the crosslinking agent used in the enlarging process.

Once a layer of the photopolymerizable composition has been coated on a suitable film support and dried, a protective overcoat layer or removable cover sheet may be laminated to the surface thereof. The photopolymerizable composition is preferably coated to give a dry coating thickness of about 0.0002 inch (50 mg/dm$^2$). A suitable film support may be selected from a wide variety of high molecular weight polymer films, e.g., polyamides, polyolefins, polyesters, vinyl polymers, and cellulose esters, and have a thickness of from 0.00025 inch (0.006 mm) to 0.008 inch (0.203 mm) or more. If exposure is to be through the support and before removing the support film, the latter must, of course, transmit a substantial fraction of the actinic radiation incident upon it. If the support film is removed prior to exposure, no such restrictions apply. If the support is to remain on the photopolymer layer, as in the case of a litho mask, it must be transparent. A particularly suitable film is a transparent polyethylene terephthalate film having a thickness of about 0.004 inch (0.102 mm).

Suitable removable cover sheets may be chosen from the same group of high polymer films described above and can have the same wide range of thicknesses. Where exposure is to be through the cover sheet or layer, it must be transparent to actinic radiation. A cover sheet of 0.0005 inch thick (0.013 mm) polyethylene terephthalate is especially suitable. The support and/or the cover film may have other layers thereon as desired, e.g., adhesive sublayers, release layers, antistatic and matte layers, etc. A developer-soluble oxygen barrier layer such as described in U.S. Pat. No. 4,072,527, U.S. Pat. No. 4,072,528 and U.S. Pat. No. 3,458,311 may be incorporated on the surface of the photopolymerizable layer in place of or in addition to the cover sheet.

In carrying out the exposure step, the supported photopolymerizable composition, prepared as described, is preferably exposed to actinic radiation from a light source, rich in ultraviolet radiation through a halftone image transparency, i.e., an image-bearing transparency consisting solely of opaque and transparent areas, wherein the opaque areas are substantially of the same optical density. However, exposure may also be through a vignetted half-tone or line screen in combination or in sequence with a continuous tone image transparency. If the transparency is an engineering drawing or printed circuit pattern the image will be a line image. Any conventional radiation source may be employed so long as it provides ultraviolet radiation, e.g., a carbon arc, a xenon arc, a mercury vapor arc, fluorescent lamps, electronic flash units and photographic flood lamps, etc.

After exposure, the element is developed by washing out with a suitable developer solvent the unexposed, unhardened, soluble portions of the photopolymerizable layer on the side that was exposed. Such solvents are well-known in the art and require no disclosure here. They are applied in various ways, as by impingement of spray jets, agitated immersion, brushing or scrubbing, to leave the desired colored, hardened, insoluble image. The result is a tone-correctable resist image which has sufficient opacity in the actinic region to be used as a mask for further exposing photosensitive compositions.

Stencil or relief image masks useful with the dot enlargement process may also be prepared from other elements using other processes. Development may be by a peel-apart procedure such as in U.S. Pat. No. 3,353,955 or by a peel-apart, solvent-washout combined procedure as described for multilayer elements in U.S. Pat. No. 4,191,572, supra. Similarly, multilayer elements using washout development alone are disclosed in U.S. Pat. No. 4,126,466, supra, and U.S. Ser. No. 142,023, supra. Duplicate image masks may be prepared from elements containing o-nitro aromatic photoinhibitors using a double-exposure process, described in U.S. Pat. No. 4,198,242, supra. Polymeric stencil masks containing partially hardened gelatin are disclosed in Belgian Pat. No. 877846, supra. Polymeric masks containing amphoteric polymeric components are disclosed in U.S. Ser. No. 153,639, supra. Polymeric masks containing gelatin and partially crosslinked polyvinyl salicylal are disclosed in U.S. Pat. No. 4,211,561, supra. For the masks exemplified by these patents to be useful in the process of this invention, they must comprise a swellable polymeric stencil or relief image in which a polymeric or colloid component of the image contains crosslinkable or reactive sites, particularly carboxylic acid sites.

The resist or stencil image, in the form of opaque polymeric dots as prepared above, could be used as a mask directly, but in accordance with the process of this invention is given a dot swelling/crosslinking treatment. The dot-enlargement process is carried out by applying to the halftone dots in the polymeric mask a dot-enlargement reagent, which is a solution containing a swelling agent (e.g., alcohols; alkoxyalkanols, halocarbons, etc.) and a crosslinking agent (e.g., organic titanates and other multivalent metal salts and metal chelates). The swelling agent effects an enlargement of the halftone dots, and it is theorized that, concurrently, the crosslinking agents link up with acid moieties in the binder component of the photopolymer matrix.

The concentrations of the two main ingredients must be balanced in order to attain the proper degree of dot enlargement. A high concentration of swelling agent and low concentration of crosslinker will yield a very large increase of dot size, and the opposite ratio will yield a much smaller increase of dot size. Other components (e.g., Freons, hydrocarbons, wetting agents, etc.) may be added to insure uniformity and rapidity of the drying process. Also, mixtures of swelling agents are helpful for treating aged films. The swelling agent/crosslinking agent combination is preferably nonaqueous and totally organic, although in the instances where the mask contains a colloid such as gelatin, an aqueous or semi-aqueous combination may be preferred.

Among the crosslinking agents which are useful in the process of this invention, two classes of organic titanates are preferred:

(I) Alkyl (or ortho) titanates which can be represented by the general structure $Ti(OR)_4$ where R is an alkyl group, e.g.:

| (A) tetraisopropyl titanate | $Ti(OC_3H_7)_4$ |
| (B) tetra-n-butyl titanate | $Ti(OC_4H_9)_4$ |
| (C) tetrakis(2-ethylhexyl)titanate | $Ti(OCH_2CHC_4H_9)_4$ |
| | $\quad\quad\quad\quad\quad\quad |$ |
| | $\quad\quad\quad\quad\quad C_2H_5$ | and (II) Titanium chelates, represented by the formula:

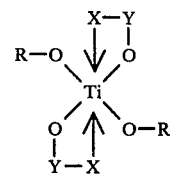

where X represents a functional group containing oxygen or nitrogen, Y represents a two- or three-carbon chain, and R is an alkyl group, e.g.

(D) The titanium acetyl acetonate chelate:

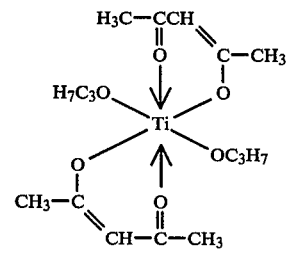

and (E) the triethanolamine titanium chelate:

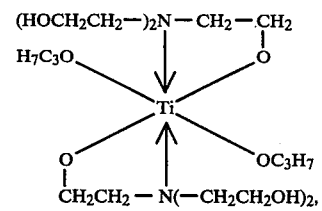

Multivalent metal salts and chelates are useful as crosslinking agents, e.g., zinc chloride; zinc acetyl acetonate, $Zn(C_5H_7O_2)_2$; mercuric chloride; stannous chloride; cupric chloride; magnesium chloride; calcium chloride; aluminum chloride; ferric chloride; ferric acetyl acetonate, $Fe(C_5H_7O_2)_3$; sodium ferric salt of ethylene diamine tetraacetic acid; ethylene diamine tetraacetic acid iron chelate sodium salt; cerium chloride heptahydrate, $CeCl_3.7H_2O$; chromium bromide hexahydrate, $CrBr_3.6H_2O$; etc. Reactive organic compounds are also useful as crosslinking agents. Such compounds generally have di- or multifunctional reactive sites and are soluble in the swelling agent solution. Examples of such compounds are the typical tanning or hardening agents for gelatin. Many of these are disclosed in Section III. B, Chapter 2 of "The Theory of the Photographic Process" (4th Ed.), edited by T. H. James; McMillan Pub. Co., Inc. NY (1977), pp. 79–84 of which are hereby incorporated by reference.

Swelling agents useful in this invention will, of course, be dependent on the nature of the imaged polymeric mask to be enlarged. Generally, organic solvents are useful swelling agents and the preferred dot-enlargement solutions of this invention employ fast drying, or volatile, organic solvents. Solvents that are effective swelling agents include alcohols, e.g., methanol, ethanol, 1-propanol, 2-propanol, 1-butanol, benzyl alcohol, etc; alkoxyalkanols, e.g., 2-methoxy ethanol, 2-ethoxy ethanol, 2-butoxy ethanol, 2-(2-ethoxyethoxy)ethanol, 2-(2-butoxy ethoxy)ethanol; ketones, e.g., acetone and methyl ethyl ketone; halocarbons, e.g., methylene chloride, methyl chloroform, ethylene dichloride, trichloroethylene, etc.; acetates, e.g., ethyl acetate and butyl acetate; and aromatic hydrocarbons, e.g., toluene and xylene. Of the swelling agents listed, alcohols and alkoxyalkanols are preferred. Although a single swelling agent is generally sufficient for use in the dot-enlargement solution, mixtures of swelling agents or mixtures of a swelling agent and inert hydrocarbon solvent and/or fluorinated hydrocarbon may be used. In some instances water may be used as a co-solvent or swelling agent.

The procedure for applying the dot-enlargement reagent to the imaged polymeric mask generally should be carefully controlled to prevent damage to the polymeric image, which is softened by the swelling action of the reagent. Ideally just sufficient reagent is needed to uniformly wet the image surface without either flooding it or applying tangential or compressive forces. Consequently, any method may be used to uniformly apply the reagent to the image area provided the method does not flood the surface with reagent liquid, and provided the method does not entail abrasive or compressive forces which would distort or mar the image.

A satisfactory method of applying the reagent is by lightly drawing across the image area the edge of a foraminous wick, soaked in reagent. If the image area is small this procedure might be accomplished with a felt-tip pen. If the image area is large, a felt-edged squeegee of sufficient length might be used. In either case the dot-enlargement reagent is supplied uniformly from the felt wick to the image area and is immediately absorbed into the image to enlarge and fix the image dots. Simultaneously, the swelling solvent of the reagent volatilizes so that a dry film is obtained. In place or felt, any foraminous material may be used such as paper, and woven and nonwoven fabrics. Similarly, the reagent may be applied as a mist, e.g., using an airbrush; or carefully coated as a liquid film. Although a separate drying period generally is not required after reagent application, such a step could be included for reagents with less volatile swelling agents.

As explained above, the major utility of dot enlargement is in making printing plates and particularly in lithographic plate making, wherein a plurality of color separation masks are employed. Enlarging the size of the exposed areas (dots) is carried out to an extent such that a composite color image produced with the masks (on a lithographic plate or on a proofing film) has the desired tonal balance.

In a typical embodiment, a printer desiring to prepare full-color prints of an original color picture or transparency, would photographically break it down through the use of a copying camera and color lens filters which transmit only selected color light, to produce four color separation negatives, preferably yellow, magenta, cyan, and black. Each of these would be photographed through a halftone screen to produce a dot pattern on a screened positive, i.e., a halftone color separation mask. After exposure and development, the imaged masks would be used to produce a full color proof, e.g., by processes disclosed in U.S. Pat. No. 3,649,268 and U.S. Pat. No. 4,174,216. If the separation masks themselves are appropriately colored as disclosed in U.S. Pat. No. 4,173,673, supra, they may be assembled, one on top of the other in register, to yield a full color proof of the original. If the color reproduction of the proof was satisfactory, each imaged photomask could be used for exposing and processing a suitable photosensitive lithographic printing plate. The latter, when processed and inked with an ink corresponding in color to that represented by the photomask, would yield prints of that color. Multiple printing from four plates which have been exposed through each of the yellow, magenta, cyan, and black imaged masks, and inked accordingly, would yield a faithfully reproduced full-color print of the original picture or process transparency.

However, it may be observed that the full color proof is, for example, not yellow enough, not magenta enough, etc., either overall or in certain regions. In this instance, the imaged photomask corresponding to the color deficiency would be corrected by dot enlargement, either overall or locally by treating with the swelling and crosslinking reagent in accordance with this invention. Then a second full color proof would be obtained from the imaged and corrected photomasks and would be reinspected again. Further corrections would be made as necessary, until the full-color reproduction desired was obtained. When satisfactory, each mask could then be used as described in "Printing Industry" by Victor Strauss, supra, to produce printing plates of various types, particularly lithographic printing plates. The further process of printing from printing plates is conventional and is not a part of this invention.

The invention will be further illustrated by the following examples, wherein parts and percentages are by weight unless otherwise noted.

EXAMPLE 1

The following photopolymerizable composition was prepared:

| Component | Parts by Weight |
| --- | --- |
| Copolymer of styrene/maleic anhydride (1.4/1) - Mol. wt. ca. 10,000 | 640 |
| Terpolymer of ethyl acrylate (56), methyl methacrylate (37) and acrylic acid (7); Acid No. 76–85; Mol. wt. ca (260,000) | 94 |
| Dispersion of (a) Terpolymer described above, 55 parts (b) Carbon black, 45 parts | 600 |
| Tetraethylene glycol dimethacrylate | 282 |
| 4,4'-Bis(dimethyl amino) benzophenone (Michler's ketone) | 50 |
| 2,2'-Bis(2-chlorophenyl)-4,4',5,5'-tetraphenyl biimidazole | 195 |
| "FC-430" (fluoro surfactant from 3M Co.) (10% in methylene chloride) | 66 |
| "Polyox" WSR-N-3000, M.W. ca 400,000 (Polyoxyethylene coating aid, Union Carbide Corp.) | 16 |
| Methylene Chloride | 4150 |
| Methyl Chloroform | 3701 |
| Methanol | 592 |
| Ethylene glycol monoethyl ether | 600 |

This material was thoroughly mixed and then machine coated on the resin-subbed side of a 0.004 inch (0.01 cm) polyethylene terephthalate film support to give a black photopolymerizable layer, with a dried thickness of 0.0002 inches (0.0005 cm). This was overcoated with a solution having the following composition and prepared as follows:

| Component | Parts by Weight |
|---|---|
| Solution A: | |
| Polyvinyl alcohol (13% in water), 98–98.8 hydrolysis; viscosity of 4% aqueous solution at 20° C. is 6–8 cps | 2840 |
| "FC-128" (fluorocarbon surfactant from 3M Co.) (5% in water) | 30 |
| Rice starch | 75 |
| "Misco" AC-392 (Polyethylene wax dispersed in water, Misco Products Co., Wheeling, Illinois (40% in water) | 434 |
| Colloidal silica (30% silica in aqueous medium) | 372 |
| Distilled water | 8920 |
| Solution: B | |
| Polyvinyl alcohol of Solution A | 85 |
| Corn starch | 15 |
| Distilled water | 248 |
| Solution B was heated to approximately 150° F. (65.5° C. for 15 minutes, cooled, and then added to Solution A to form a bulk solution. | |
| Solution C: | |
| Polyvinyl alcohol of Solution A | 324.4 |
| "FC-128" of Solution A | 3.3 |
| Rice starch | 8.3 |
| Corn starch | 21.0 |
| Colloidal silica of Solution A | 41.3 |
| Distilled water | 1129.0 |
| Solution C was added at a rate of 1:10 to the bulk solution and immediately coated over the black photopolymerizable layer to give a dry overcoat thickness of 0.00025 cm. | |

PREPARATION OF HALFTONE LITHO MASK

The resulting film was imagewise exposed through a halftone transparency to the light from a 4 kw pulsed xenon light source (Macbeth Activarc Type MK 40HL) for 45 sec. The imaged film was spray developed at 72° F. with a developer composed of 840 g $K_2CO_3$, 50 g $KHCO_3$, and 16 l water in a CRONA-LITE Model II processor (a product of E. I. duPont de Nemours and Company) at a rate of 95 inches per minute and water-rinsed at a temperature of 100° F. The resulting stencil halftone image consisted of opaque, shallow-relief, polymeric, dot areas on the transparent support film along with complementary uncovered areas where the unexposed photopolymerizable material was removed by development.

DOT ENLARGEMENT PROCESS

Three dot-enlargement reagents having different capabilities of permanently enlarging halftone dots were prepared from a swelling agent and a crosslinking agent by varying the proportions of the mixture. The swelling agent was isopropanol and the crosslinking agent was the titanium chelate of acetyl acetonate, identified above as "D", which is available from the DuPont Company as a 75% by weight isopropanol solution, TYZOR AA titanium acetyl acetonate. The enlarging reagents consisted of 1 part by volume of the 75% titanium chelate solution and respectively 1, 5, and 20 parts by volume isopropanol. The three solutions are identified as Enlarging Reagent "a", "b" and "c" respectively. Each of the Enlarging Reagents was placed in a FLO-MASTER Felt-Tip Pen (a product of Faber-Costell Corp., Lewisburg, Tenn.) in which the felt-tip was a 1 cm wide rectangle.

Each of the three reagents was applied to individual, similarly imaged and processed, halftone litho masks (described above) by drawing across the image the 1 cm edge of the pen's felt tip. The areas of each mask where each solution made contact with the halftone dots enlarged very rapidly and irreversibly by an amount dependent upon the reagent concentration. In particular, for halftone dots in mid-tone areas of each mask, the dot size area increase is given in the following Table.

| Enlarging Reagent | Volume Ratio Titanium Solution: Isopropanol | % Dot Area Increase |
|---|---|---|
| "a" | 1:1 | 2–3% |
| "b" | 1:5 | 7–8% |
| "c" | 1:20 | 12–13% |

Using appropriate applicators as described above, such as felt-edged squeeges or felt-tip pens, the process can be very uniform, even on large pictures or tints, or can be used for changing small areas of images.

EXAMPLE 2

The effectiveness of crosslinking agents and swelling agents for enlarging and fixing the size of image halftone dots may be evaluated using the following simple test procedure.

A photopolymerizable film element is prepared, imaged, and developed as described in Example 1 except that the halftone transparency is a target having uniform tints representing highlights . (10%), mid-tones (50%), and shadows (90%). A portion of the mid-tone region of the developed film is first treated, using the application procedure of Example 1, with a solution having a very high concentration of crosslinking agent: e.g., a solution containing 10 g isopropanol, 0.5 g aluminum chloride, and 20 g hexane. The degree of enlargement with this treatment is slight. After the treated area has dried, a second portion of the mid-tone region which overlaps previously untreated and treated areas is next treated with a second solution containing a lower concentration of the same crosslinking agent: e.g., a solution containing 20 g isopropanol, 0.1 g aluminum chloride, and 10 g hexane. While dots are enlarged in the previously untreated areas to give a darker tint, there is no apparent change in the dot size or tint due to the second treatment where it came in contact with dots that were first treated with the high concentration solution. It is concluded that $Al^{+3}$ ion is an effective crosslinking agent and that it will function to permanently fix enlarged dots.

Dot-enlarging solutions were prepared by adding each of the following cross-linking agents to a solution containing 10 g isopropanol, 2 g 2-ethoxy ethanol, and 20 g hexane:

| Cross-linking agent | g. added each solution |
|---|---|
| Mercuric chloride | 0.2 |
| Ferric chloride | 0.4 |
| Stannous chloride | 0.1 |
| Cupric bromide | 0.2 |
| Magnesium chloride | 0.2 |
| Calcium chloride | 0.2 |
| Zinc chloride | 0.2 |
| Chromium bormide ($CrBr_3.6H_2O$) | 0.2 |

Using the above procedure, these solutions were found effective in enlarging and permanently fixing the size of the mid-tone dot area.

EXAMPLE 3

A coating composition was prepared from a solvent solution of the following ingredients:

| Component | Parts by Weight |
| --- | --- |
| (a) Methylene chloride solvent | 434 |
| (b) Methanol solvent | 47 |
| (c) Copolymer of methylmethacrylate (90 Mole %) and methacrylic acid (10 Mole %), mol. wt. range about 30,000–50,000 | 50 |
| (d) Polymethylmethacrylate, high mol. wt., 0.9 inherent viscosity | 3 |
| (e) 2,2'-Bis(2-chlorophenyl)-4,4',5,5'-tetraphenyl biimidazole | 8 |
| (f) 4,4'-Bis(dimethyl amino) benzophenone (Michler's ketone) | 3 |
| (g) Mixed ester of triethylene glycol-dicaproate and dicaprylate, refractive index 1.4460 at 25° C. | 2 |
| (h) Trimethylol propane triacrylate | 33 |
| (i) 2-Mercaptobenzothiazole | 1 |
| (j) Grasol Fast Orange 2RN, C.I. Solvent Orange 33 (a mixture of Solvent Red 30, C.I. 27291 and dicyclohexylamine salts of a bisazo-disulfo acid dye). | 24 |

After thorough mixing, the photopolymerizable composition thus formed was coated on the resin sub layer of a polyethylene terephthalate clear film support. After hot air drying, the dry photopolymerizable layer was about 0.0003 inch (0.0076 mm) thick and had an optical density of about 4 over the spectral range 300–500 nm. The resulting product was laminated with a clear, biaxially oriented and heat-set polyethylene terephthalate film, serving as a removable cover sheet, to yield a composite element.

A sample of the composite element was exposed for two minutes to actinic radiation through a 50% tint mask (150 line screen) using the 4 kw pulsed xenon light source of Example 1. After the cover sheet was removed, the exposed element was soaked for 90 seconds in a developer solution of the following ingredients:

|  | Parts by Weight |
| --- | --- |
| Sodium carbonate monohydrate | 35 |
| Diethylene glycol monobutyl ether | 226.5 |
| Distilled water | 3290. |

After soaking in developer, the element was rinsed with tap water and cleaned thoroughly with a water-soaked pad having a 1 inch-thick plush acrylic fiber pile. When dried the resulting element was an orange halftone tint mask having roughly 50% dots.

A portion of the halftone tint mask was treated with the dot-enlarging solution identified in Example 1 as Enlarging Reagent "b", containing 1 part by volume of the 75% titanium chelate solution and 5 parts by volume isopropanol. The dot-enlarging solution was applied as in Example 1 by means of a felt-tip pen to a small area of the element. The area of the orange halftone dots treated was enlarged about 2 to 3%, indicating that tonal balance of selected portions of halftone images can be directly adjusted by using a selected strength of dot-enlargement solution.

EXAMPLE 4

This Example illustrates the use of dot enlargement to prepare color-coded photomasks useful both as an alternative proofing system and for preparing printing plates for full color printing.

A yellow, a magenta, and a cyan halftone target was prepared from correspondingly colored photopolymerizable elements as described in Example 20 of U.S. Pat. No. 4,173,673. When the three halftone targets were assembled in register to form an overlay proof it was observed that the overall tonal balance of the proof was judged deficient in yellow. The yellow halftone target was removed from the overlay assembly and uniformly treated with the dot-enlargement solution of Example 3, using the following procedure: a felt-edged squeegee was soaked with the solution, and then the felt edge drawn across the halftone surface at a rate and pressure sufficient to wet the surface without flooding or abrading it. In effect, the applicator was a uniform thin-edged wick. In this mode of operation, sufficient solution was metered onto the surface, the halftone dots were enlarged and simultaneously fixed, and the excess solvent immediately evaporated to give a dot-enlarged target which could be immediately reassembled with the other target to form a tone-corrected overlay proof. Each of the targets could then be used to produce the appropriate printing plate by conventional methods.

EXAMPLE 5

A composite, multilayered photopolymerizable element capable of forming duplicate images was prepared as described in Example 7 of U.S. Pat. No. 4,162,162.

The composite element was exposed for 25 seconds to a 4 kw pulsed xenon arc at a distance of 60 inches (152.4 cm) through a photomask having a 50% tint (150 line screen) in contact with the cover sheet. The photomask was then removed and the element reexposed for 3 minutes to the same light source through a cut-off filter which absorbs all light below 400 nm. The cover sheet was then removed and the film processed through an automatic processor (described in U.S. Pat. No. 4,142,194) at about 90 inches/min (229 cm/min) and 72° F. (22.2° C.), to produce an exact duplicate of the original photomask.

A portion of the duplicate mask produced was subjected to the dot-enlargement process of Example 1 using the enlarging reagent identified as "b", containing 1 part by volume of the 75% titanium chelate solution and 5 parts by volume isopropanol. The area of the duplicate subjected to the dot-enlargement process was visually darker, and the areas of the treated black halftone dots increased by about 8%.

EXAMPLE 6

The test procedure described in Example 2 was repeated using the following dot enlargement reagents:

| Enlarging Reagent | Components | Parts by Weight |
| --- | --- | --- |
| "a" | tetraisopropyl titanate | 1 part |
|  | isopropanol | 10 parts |
| "b" | Zinc (acetylacetonate)$_2$ | 1 part |
|  | 2-ethoxy ethanol | 3 parts |
| "c" | Ferric chloride | 1 part |
|  | isopropanol | 12 parts |
|  | water | 12 parts |

In each case the enlarging reagent enlarged the halftone dots, to produce darker visual tints only in the areas treated with the reagent.

We claim:

1. A process of permanently enlarging the area covered by a polymeric relief image containing crosslinkable moieties useful as a polymer mask, which process consists essentially of contacting the image area with a solution containing a swelling agent to effect image enlargement, and a crosslinking agent to react with and link the crosslinkable moieties of said polymeric relief image, whereby the image is enlarged and is fixed in its enlarged state.

2. The process of claim 1 wherein the polymer mask is a photopolymerized or photocrosslinked mask.

3. The process of claim 1 wherein the crosslinkable moieties of the polymer mask are free acidic groups.

4. The process of claim 3 wherein said free acidic groups are carboxyl groups.

5. The process of claim 3 wherein the swelling agent comprises at least one member of the group consisting of an alcohol, an alkoxyalkanol, a ketone, a halocarbon, an acetate, and an aromatic hydrocarbon.

6. The process of claim 3 wherein the crosslinking agent is one selected from the group consisting of an organic titanate, a multivalent metal salt, and a metal chelate.

7. The process of claim 1 wherein the image formed in the polymer mask is one selected from the group consisting of a half-tone image, engineering drawing, and a printed circuit pattern.

8. In a process of image reproduction which comprises (1) imagewise exposing to actinic radiation through a transparency a film consisting essentially of a photopolymerizable layer coated upon a transparent support, whereby the exposed areas polymerize and harden, and (2) developing said film by removing the unexposed areas of the layer with a solvent so as to leave a dot image mask on the support, the improvement comprising employing in the photopolymerizable layer a polymeric binder which contains carboxyl groups, and contacting the aforesaid dot image mask with a solution containing (a) a swelling agent in order to effect dot enlargement, and (b) a crosslinking agent to react with and link the carboxyl groups of said polymeric binder, whereby the dots are enlarged and are fixed in their enlarged state.

9. The improvement of claim 8 wherein the developer solvent is a predominantly aqueous solution.

10. The improvement of claim 8 wherein the swelling agent comprises at least one member of the group consisting of an alcohol, an alkoxyalkanol, a ketone, a halocarbon, an acetate, and an aromatic hydrocarbon.

11. The improvement of claim 8 wherein the crosslinking agent is one selected from the group consisting of an organic titanate, a multivalent metal salt, and a metal chelate.

12. The improvement of claim 8 wherein the imagewise exposing steps comprise exposing through a continuous tone original and a vignetted halftone screen.

13. The improvement of claim 8 wherein the imagewise exposing and development steps produce one of a plurality of color separation masks, and the dot enlargement is carried out to an extent such that a composite color image produced with the several masks has the desired tonal balance.

14. The improvement of claim 13 wherein each of said color separation masks has been exposed through a different color separation negative and has been colored in a spectral region corresponding to the color separation negative.

15. The improvement of claim 14 wherein the masks and color separation negatives correspond, respectively, to yellow, magenta, cyan, and black.

16. The improvement of claim 8 wherein the photopolymerizable layer consists essentially of:
    (a) an ethylenically unsaturated monomer capable of forming a high molecular weight polymer by free radical-initiated, chain-propagating, addition polymerization, 10–30% by weight,
    (b) a polymeric binder, 10–60% by weight,
    (c) a free radical-generating addition polymerization initiator system activatable by actinic radiation, 0.1–20% by weight, and,
    (d) an actinic radiation-absorber, present in such concentration as to impart an optical density to the photopolymerizable layer of at least 3.0 over at least the spectral range of 350–400 nm.

17. The improvement of claim 8 wherein the transparency is a halftone image transparency.

18. The improvement of claim 8 wherein the transparency is either a halftone image or line screen in combination with or in sequence with a continuous tone image transparency.

19. The improvement of claim 18 wherein the transparency is an engineering drawing.

20. A process for permanently enlarging the half-tone image dot area of a photopolymer litho mask wherein the image areas comprise a polymeric relief image useful as a stencil in which the polymeric relief image contains crosslinkable moieties, and wherein said image areas consist of hardened upper skins which rest on softer undervolumes having a lesser degree of polymerization or hardening, characterized in that the image is contacted with a solution containing (1) a swelling agent to effect image enlargement, and (2) a crosslinking agent to react with and link the crosslinkable moieties of said polymeric relief image, whereby the image is enlarged and is fixed in its enlarged state.

* * * * *